United States Patent [19]

Sacca

[11] Patent Number: 5,680,075
[45] Date of Patent: Oct. 21, 1997

[54] DIGITAL AUTOMATIC GAIN CONTROL

[75] Inventor: Frank Sacca, West Covina, Calif.

[73] Assignee: Casio PhoneMate, Inc., Torrance, Calif.

[21] Appl. No.: 455,246

[22] Filed: May 31, 1995

[51] Int. Cl.$^6$ ............................................. H03G 3/30
[52] U.S. Cl. ............................................. 330/279; 330/136
[58] Field of Search ............................. 330/129, 136, 330/144, 145, 278, 279, 282, 284

[56] References Cited

U.S. PATENT DOCUMENTS

| | | | |
|---|---|---|---|
| 3,969,683 | 7/1976 | Fabricius | 330/129 X |
| 4,101,841 | 7/1978 | Okada et al. | 330/279 X |

FOREIGN PATENT DOCUMENTS

| | | | |
|---|---|---|---|
| 63111 | 5/1980 | Japan | 330/284 |
| 90408 | 5/1985 | Japan | 330/282 |

OTHER PUBLICATIONS

Jack Smith; Modern Communication Circuits; 1986; pp. 188–189; Automatic Gain Control; Mc–Graw–Hill Book Company.

Braquet et al. "Digitally Controlled Automatic Gain Control Circuit", *IBM Technical Disclosure Bulletin*, vol. 18, No. 6, Nov. 1975, p. 189.

*Primary Examiner*—James B. Mullins
*Attorney, Agent, or Firm*—Frishauf, Holtz, Goodman, Langer & Chick

[57] ABSTRACT

A digital automatic gain control system includes an envelope detector coupled to a system input for converting an AC input signal into a DC output signal. An analog-to-digital converter has an input coupled to receive the output signal of the envelope detector and an output coupled to a digital register controlled by a digital control circuit. A programmable gain amplifier has control inputs coupled to receive an output of the digital register for controlling the gain of the programmable gain amplifier such that the signal level at a system output of the programmable gain amplifier remains substantially constant as the signal level at the system input varies within a specified dynamic range.

16 Claims, 8 Drawing Sheets

DIGITAL AUTOMATIC GAIN CONTROL

BACKGROUND OF THE INVENTION

This invention relates to automatic gain control systems, and more specifically to digital automatic gain control systems which are particularly suitable for integration in CMOS application specific integrated circuits (ASIC).

Automatic Gain Control (AGC) is the automatic adjustment of an amplifier gain to maintain a substantially constant output level over a specified dynamic range of input signals. Two important parameters characterize an AGC system: the "attack time" and the "recovery time." The attack time is the time required by the AGC to decrease the gain from maximum to minimum, when excited by the largest signal specified in the input dynamic range. The recovery time is the time required by the AGC to increase the gain from minimum to maximum, when excited by the smallest signal specified in the input dynamic range. A block diagram of a standard AGC system is shown in FIG. 1.

The known system of FIG. 1 comprises a variable-gain amplifier or VGA 2, and a feedback circuit that provides a control voltage Vc. If the input and output voltages of the VGA 2 are denoted Vi and Vo, respectively, the VGA 2 obeys the exponential control law Vo=K*exp[Vc]*Vi. The feedback circuit comprises a logarithmic amplifier 4 and an envelope detector 6 with a large time constant (compared to the period of the lowest frequency to be detected). Control voltage Vc is a negative feedback control signal that dynamically adjusts the gain of the VGA to maintain Vo constant within a small range.

Depending on technical requirements, the AGC components described hereinabove are implemented using the most cost-effective solution. Generally, the VGA is implemented in bipolar integrated technology with a multiplier cell. The control voltage Vc is multiplied by the input voltage Vi, and the multiplier effectively acts as a VGA with an output signal Vo proportional to Vc. In a discrete approach, the VGA can be implemented with a JFET transistor (a voltage-controlled resistor) in conjunction with an operational amplifier. The control voltage Vc affects the resistance of the JFET transistor, which in turn changes the gain of the operational amplifier as a function of Vc. The logarithmic amplifier can be an operational amplifier with a feedback diode, and the envelope detector can be a simple peak-hold circuit.

Generally, a traditional AGC design is not implemented in CMOS technology because the VGA portion is expensive to integrate, if it can be integrated at all. Nonetheless, CMOS technology is the most cost-effective solution for many ASIC designs, and therefore it is necessary to adopt a new scheme for an AGC circuit intended for CMOS integration.

The AGC system described on page 138 of "Electronic Design" magazine dated Sep. 16, 1982 provides one design option for CMOS integration. The design consists of the same standard blocks described hereinabove for a standard AGC system: a VGA, and a feedback control circuit coupled to the VGA. The feedback control circuit is a common envelope detector that generates control voltage Vc, but the VGA is a digital system that can be integrated in CMOS technology. The VGA comprises a window comparator with two reference voltages, and a programmable-gain amplifier (PGA) controlled by an up/down counter. Control voltage Vc is fed to the window comparator. If Vc is greater than an upper reference, indicating that Vo is larger than the desired level, the counter will count down to decrease the PGA gain. Alternatively, if Vc is less than a lower reference, indicating that Vo is smaller than the desired level, the counter will count up to increase the PGA gain. If Vc is in the window between the upper and lower references, the counter will not advance in either direction and the PGA gain will remain constant. Unfortunately, a fundamental problem is associated with this approach, as explained in the following discussion.

For audio signals, the attack time of an AGC should be in the range of about 5 milliseconds (ms) to about 30 ms, while the recovery time should be in the range of about 1 second (s) to about 5 s. The attack time is very short because the output Vo is expected to reach the desired value as soon as possible after an input signal is applied to the AGC. On the other hand, the recovery time is relatively long because the AGC gain is expected to remain approximately constant after a given audio signal has determined the initial gain.

In a telephone answering machine, for example, a telephone message is recorded on a magnetic tape using an AGC circuit. Depending on the communication conditions of a telephone call, the incoming signal can have a dynamic range of about 40 dB; after a connection is established only a small dynamic variation is observed during the call (except when speech is interrupted). Because a dynamic range of 40 dB would result in a highly degraded recording quality on a magnetic tape (a small signal would cause a small signal-to-noise ratio while a large signal would be clipped), it is necessary to use an AGC circuit to compress the incoming signal to a range of about 3 dB. When a call is received, the AGC gain is set to the appropriate value in a short time (the attack time), and then it is expected to remain the same for the duration of the call. Since noise or other unexpected effects may compromise the correct setting of the initial gain, it is not convenient to fix the AGC gain based on the telephone signal at the beginning of a call. A better approach is to make the AGC recovery time relatively long, typically about 3s to 4 s, so that the gain will remain virtually the same for the duration of the call even during a pause in speech (normally about 1 s or 2 s), but at the same time an undue gain setting caused by noise can be corrected within a few seconds.

The AGC circuit proposed by "Electronic Design" fails to function adequately if a fast attack time and a slow recovery time are required. For example, assume that the envelope detector of the system has a time constant of about 3 s. When a medium-level signal is detected, the counter would start counting down (reducing the gain of the PGA) because the detector voltage is above the reference window. However, because the recovery time is 3 s, the control voltage will remain above the window for about 3 s and the counter will continue to count down until the PGA gain is at minimum. Even though the PGA gain should be set to about 50% for a medium-level signal, it ends up all the way down to minimum, which is clearly a malfunction. One way to correct this problem is to make the time constant of the envelope detector small, say in the order of about 100 ms, and to use a slow clock speed to count up, resulting in a slow recovery time, and a fast clock speed to count down, resulting in a fast attack time. The detector circuit then can be adjusted to an optimal time constant without affecting the attack and recovery time requirements. This approach can effectively correct the malfunction described, but unfortunately it does not work. For example, if the AGC input is an audio signal and the detector time constant is about 100ms (or any other comparable value), control voltage Vc will change too fast over time and will go inside and outside the reference window too often as speech progresses, even though the speech average power remains the same. The result is gain instability and unwanted noise in the output signal of the AGC system.

An object of the present invention is to provide a digital AGC system that can be integrated using inexpensive CMOS technology, and which provides the same functional characteristics of traditional, well-proven designs.

Another object of the present invention is to provide an AGC system that can be easily incorporated into an application specific integrated circuit (ASIC).

Still another object of the present invention is to provide a simple, external control for AGC characteristics, and to provide an AGC system that is free of noise (no oscillation).

SUMMARY OF THE INVENTION

According to the present invention, a digital automatic gain control system having a system input and a system output, comprises an envelope detector coupled to said system input for converting an AC input signal into a DC control output signal; an analog-to-digital converter coupled to said DC control signal for converting the control signal into digital outputs; a digital register having inputs coupled to the digital outputs of the analog-to-digital converter, and outputs which are updated by a digital control circuit; a programmable gain amplifier having an input coupled to receive the AC input signal from the system input, and an output coupled to the automatic pain control system output. The programmable gain amplifier control inputs are coupled to the digital register outputs. The digital control circuit updates the content of the digital register with the analog-to-digital converter outputs thereby controlling the gain of the programmable gain amplifier such that the automatic gain control system output signal level remains substantially constant as the signal level at the system input varies within a specified dynamic range.

DETAILED DESCRIPTION

Figure 1:
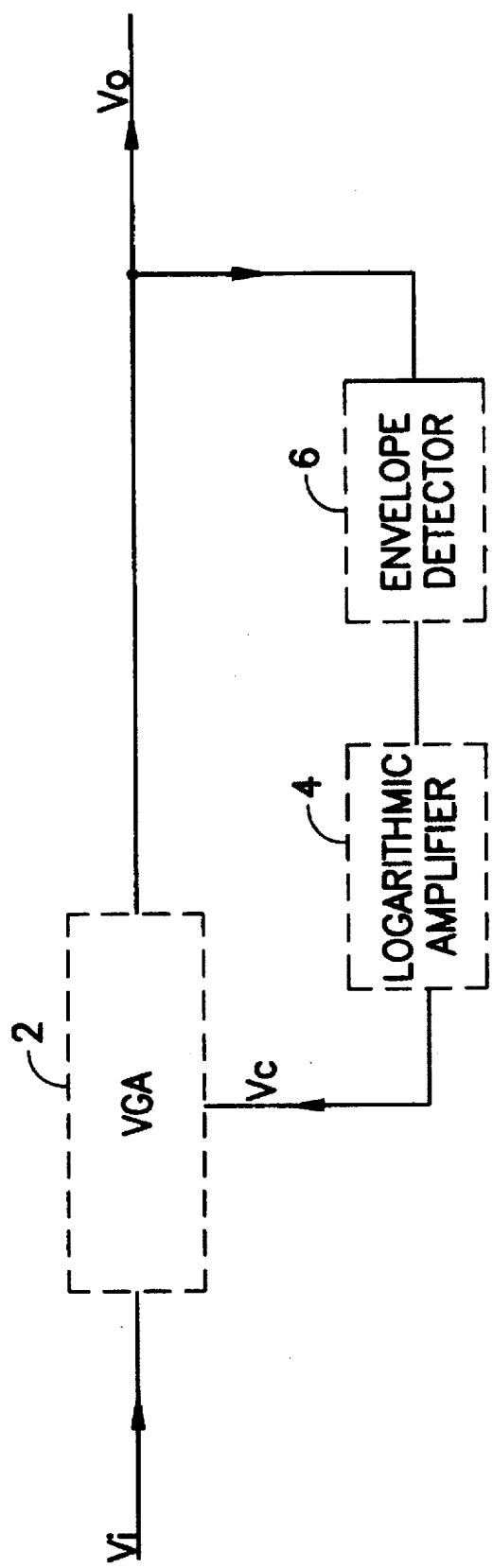
FIG. 1 is a block diagram of a conventional AGC system.
Figure 2A:
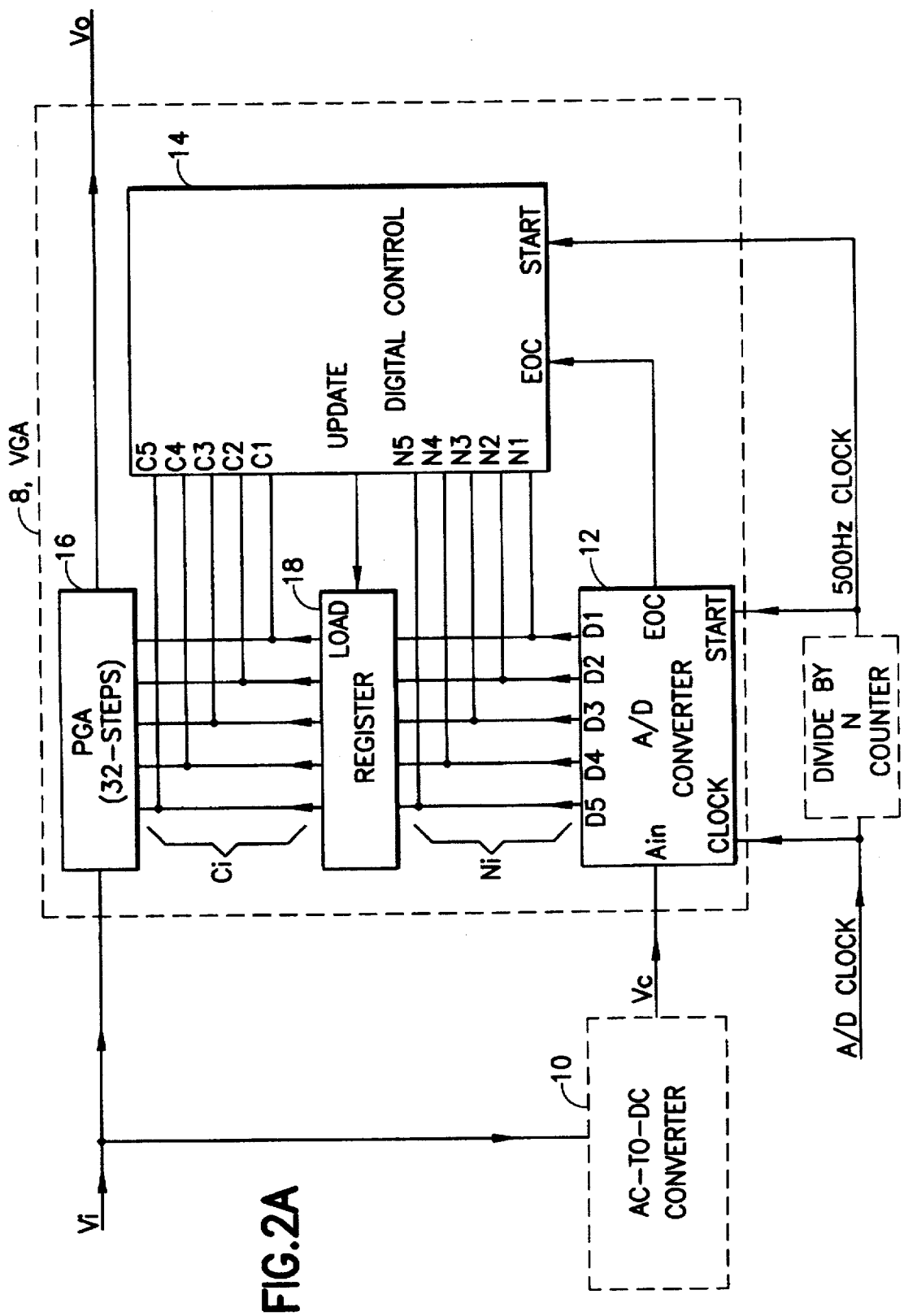
FIG. 2A is a block diagram of a digital AGC system according to the present invention.

FIG. 2A shows the preferred configuration of the digital AGC system disclosed. The system of FIG. 2A can be divided in two main blocks: an AC-to-DC converter 10 and a VGA 8. The VGA 8 comprises three main subunits: an A/D converter 12, a digital control circuit 14 with a register 18, and a programmable-gain amplifier (PGA) 16.

The AC-to-DC converter circuit 10 provides a DC control voltage Vc having a direct, logarithmic relationship to input signal Vi (Vc becomes larger as Vi increases in amplitude, and Vc becomes smaller as Vi decreases). The A/D converter 12 converts control voltage Vc to a 5-bit binary code Ni, representing the amplitude of input signal Vi. The binary code Ni is then loaded to the output of register 18 by the digital control circuit 14, and a binary code Ci is presented to the digital control input of the PGA 16. Because the binary code Ci (equivalent to Ni) has a direct relationship to Vi, the PGA 16 must obey an inverse control law such that, for example, binary code 11111 (corresponding to a large value of Vi) sets the gain of the PGA to minimum, while binary code 00000 (corresponding to a small value of Vi) sets the gain of the PGA to maximum. In general, a large input signal Vi will cause the gain of the PGA 16 to decrease, and a small input signal Vi will cause the PGA gain to increase. The same outcome would result if the PGA control law was direct, and the relationship between Ni (or Vc) and Vi inverse.

The relationship between the gain of the PGA 16 and the input signal Vi can be formulated using mathematical expressions. Control voltage Vc is a function of Vi, i.e., Vc=f(Vi), and the gain (GAIN) of the PGA (the control law) is a function of Vc, i.e., GAIN=g(Vc). Also, Vo=GAIN · Vi. To maintain Vo=constant (K) for any input signal Vi, it is necessary to satisfy the following equations:

$$Vo=GAIN*Vi=K==>GAIN*Vi=K,$$

and expressing all quantities in decibels (dB)

$$20log(GAIN*Vi)=20log(K)==>20log(GAIN)+20log(Vi)=K1==>GAIN(db)=K1-20log(Vi), \quad (1)$$

where GAIN(db) is the PGA gain expressed in dB and K1 is a constant. If Vc is chosen to be a logarithmic function of Vi, Vc=K2*log(Vi), then log(Vi)=Vc/K2, and substituting in equation (1) above $$GAIN(db)=K1-K3*Vc, \quad (2)$$

where K2 and K3 are constants. In other words, if the PGA control law is exponential (the gain is linear in decibels) and Vc is a logarithmic function of Vi, the relationship between the PGA gain and Vc can be linear. This can be accomplished by using a standard, linear A/D converter 12 between the signal Vc and the PGA 16, as shown in FIG. 2A. An alternative solution would be to combine a PGA obeying a linear control law with an A/D converter having a non-linear, exponential output/input characteristic. The relationship between the PGA gain and Vc would still be linear and equation (2) would still be satisfied.

The equation Vo=K is satisfied for any function Vc=f(Vi), provided that the PGA control law is GAIN=g(Vc)=invf (Vc), where invf(Vc) is the inverse function of f(Vi). In the example hereinabove, logarithmic and exponential functions were chosen for Vc and GAIN, respectively. Alternatively, suppose that Vc is chosen to be a linear function of Vi. If the AGC dynamic range is about 40 dB, for example, the range of Vi can vary by a factor of about 100, say from about 10 mV to about 1V. This implies that the A/D converter has to resolve a 1V range in 10 mV steps (at least 100 steps) to accurately control the PGA gain and keep Vo constant, which would require a more expensive 7-bit converter (128 steps). On the other hand, if Vc is compressed logarithmically as a function of Vi, a small signal and a large signal will generate comparable increments that can be quantified sufficiently with only a 5-bit A/D converter, thus reducing the system cost. Alternatively, signal Vc could be a linear function of Vi and the compression would be accomplished by a logarithmic type A/D converter (the digital output is a logarithmic representation of the input signal). The resolution required in this case would still be 5 bits.

Figure 2B:
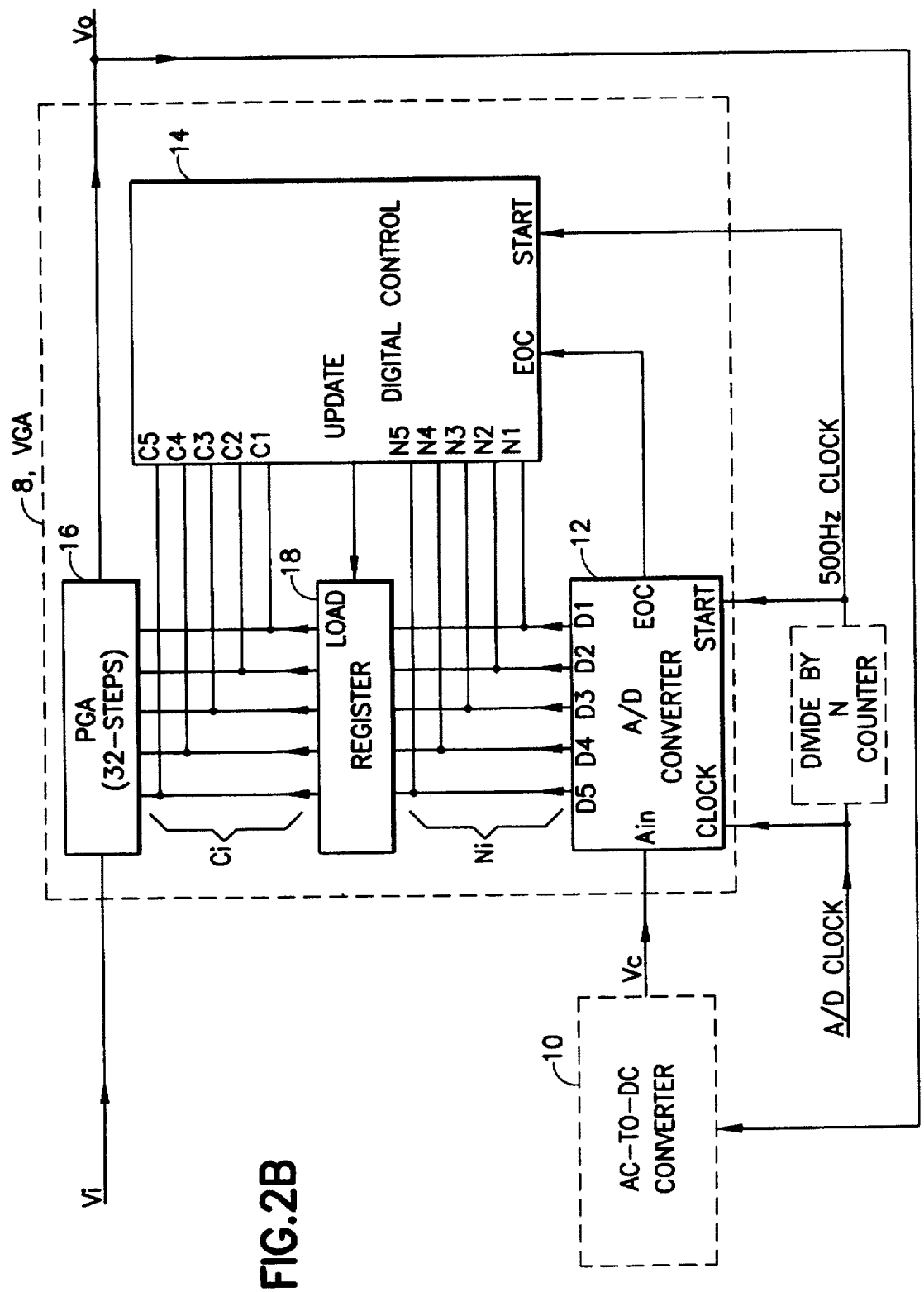
FIG. 2B is a block diagram of a modified AGC system according to the present invention.

The AGC system shown in FIG. 2A is an open-loop system (the control voltage Vc is not derived as a function of the output Vo). An alternative closed-loop configuration is shown in FIG. 2B. The AC-to-DC converter 10 is connected to the output voltage Vo and derives the control voltage Vc as a function of Vo [Vc=f(Vo)]. Such a closed-loop system can be described mathematically by a linear differential equation, provided that Vo and Vi are expressed in decibels (dB). With the same assumptions made for the function Vc and the PGA control law in the open-loop configuration, a solution to the equation exists, but the solution in general is not satisfied because the PGA gain varies in discrete steps as a function of Vc. For example, suppose that the solution required to satisfy the differential equation for a given constant input Vi is a value of GAIN=13.5 dB. Because the PGA gain can be set only in discrete steps, for instance at 13 dB or 14 dB, the solution will not be satisfied at either setting and therefore the PGA gain will oscillate from 13 db to 14 dB and vice versa. As a result, the output Vo will oscillate in amplitude by 1 dB, even though the input Vi is constant. In general, an intermediate value between two discrete gain settings is required to satisfy the differential equation for a given input Vi, and instability is introduced in the output Vo of the AGC. The instability can be reduced by increasing the number of gain steps of the PGA for a given dynamic range of the AGC, thereby reducing the amplitude variation of Vo when the gain oscillates between two discrete settings. However, this countermeasure would be costly because more resolution would be required in the A/D converter, and additional circuitry would be needed in the PGA and digital control circuit. The open-loop AGC configuration does not suffer this drawback, and therefore, only the open-loop AGC system of FIG. 2A will be the subject of the present discussion.

Two factors that can compromise the AGC performance are the accuracy of the A/D converter 12 and unwanted noise present in the AGC physical system. In general, an inexpensive A/D converter provides a digital output that varies by +/- 1 least significant bit (LSB) from the correct digital representation of an input signal. For example, if an input voltage is correctly represented by decimal 10, the A/D converter will represent it as decimal 9, 10, or 11 on repeated conversion cycles. This phenomenon occurs because of unwanted noise (digital clock noise, hum, etc.) in the internal references of the converter and the input signal to be converted, and also because the A/D converter has to approximate an input signal to the nearest digital representation available. Even in a sophisticated A/D converter, it is still possible to obtain two digital representations of the same input signal on repeated conversion cycles, because the converter is only accurate to the nearest ½ LSB and unwanted noise can cause the output to oscillate between two adjacent digital values.

For a given control signal Vc, the converter 12 will therefore make an error up to +/- 1 LSB. Since the output of the A/D converter 12 affects the gain of the PGA 16, a variation of +/- 1 LSB will result in a random amplitude variation of output signal Vo by +/- 1 gain step, even if a constant signal Vi is applied to the AGC input. This effect is undesirable (the output Vo should be steady for a constant input Vi) and must be corrected with a digital control circuit 14. A storage register 18 (FIG. 2A) holds the current PGA gain setting Ci, and for each conversion cycle a digital magnitude comparator 30 (FIG. 5) indicates whether the new reading Ni, representing Vc, is smaller or larger than the value Ci stored in the register 18. When the new conversion reading Ni is less than the current PGA gain setting Ci, indicating that signal Vi is decreasing, a digital counter 32 (FIG. 5) is advanced by one count and the register 18 is not updated. If this condition occurs consecutively 15 times, the counter 32 becomes full and the register 18 is updated (making the PGA gain increase). On the other hand, when the new conversion reading Ni is larger than the current PGA gain setting Ci, indicating that signal Vi is increasing, the register 18 is updated immediately (making the PGA gain decrease immediately) and the digital counter 32 is reset. Without conflicting with the requirements of a fast attack time and a slow recovery time, this scheme ensures that random positive and negative variations in the output of the A/D converter 12 are not reflected in the PGA gain setting, and therefore it improves the output stability of the AGC.

Figure 3A:
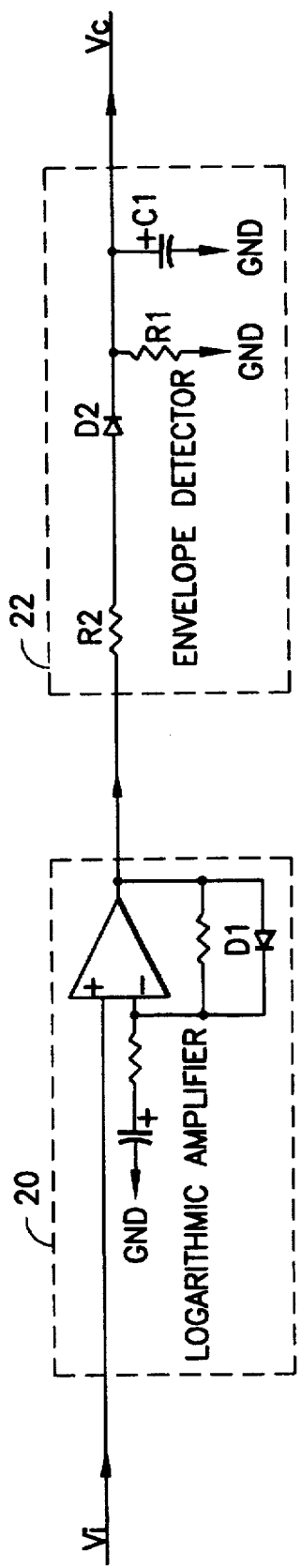
FIG. 3A is a block diagram of the AC-to-DC converter of FIG. 2A.
Figure 4:
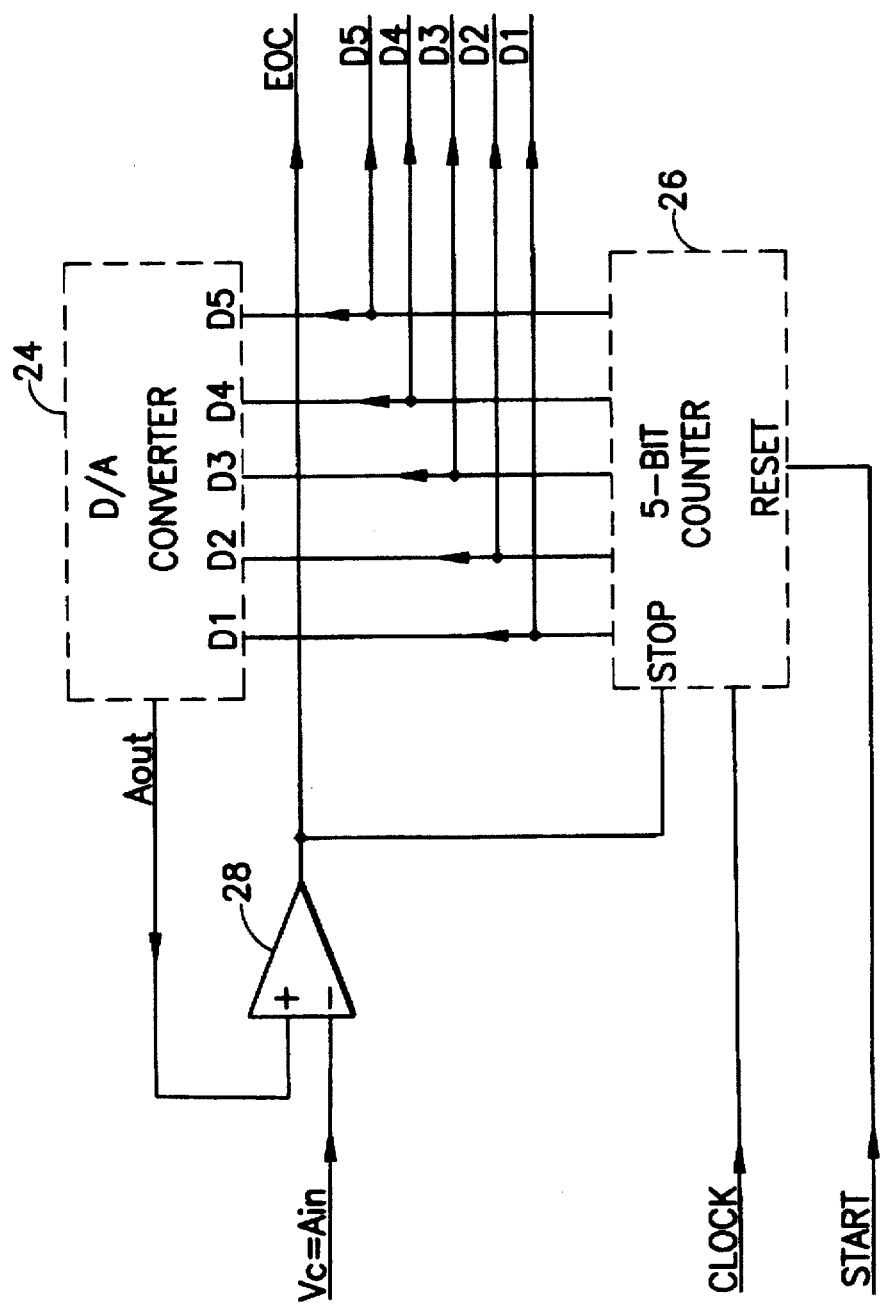
FIG. 4 is a block diagram of the A/D converter of FIG. 2A.
Figure 5:
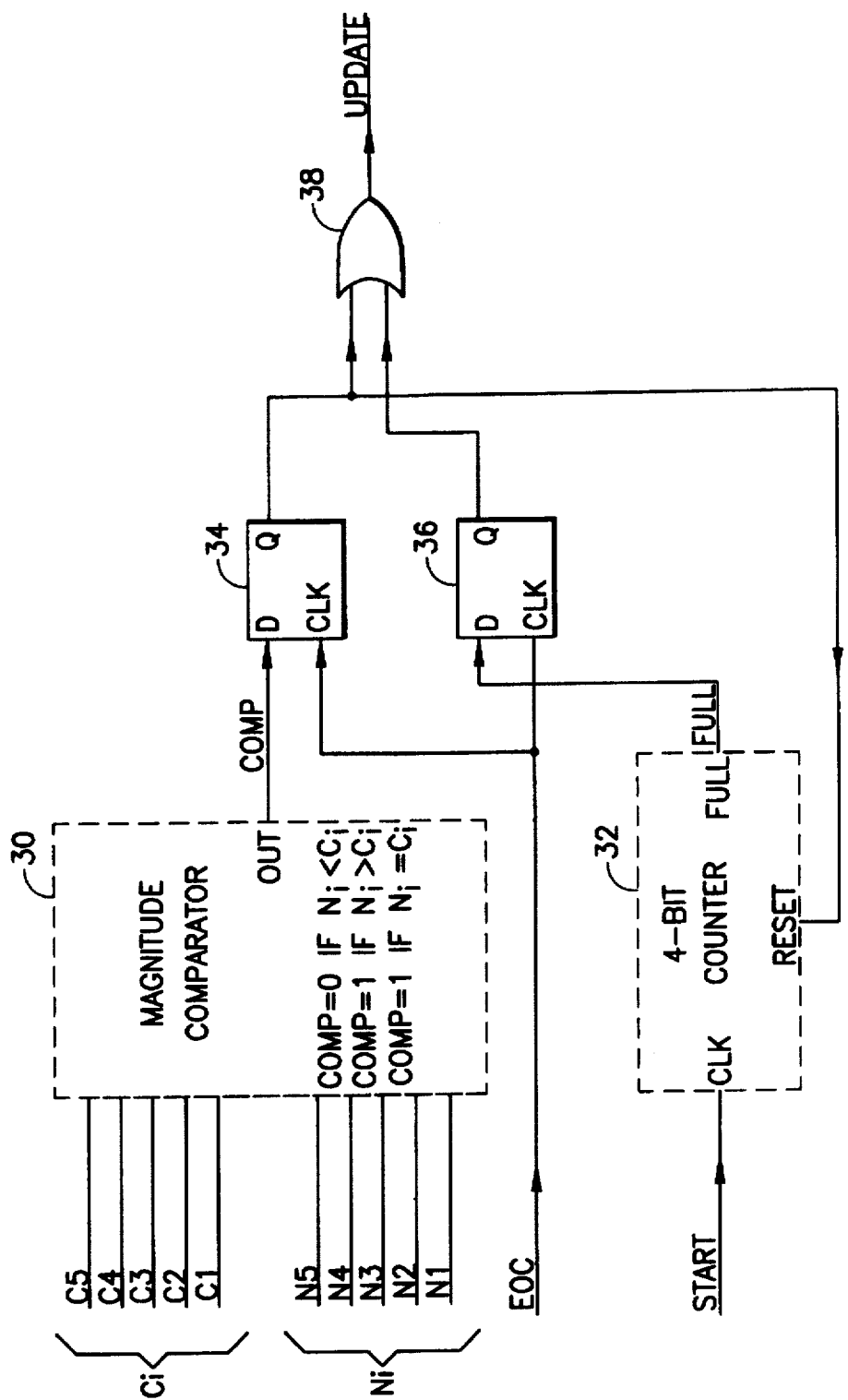
FIG. 5 is a block diagram of a digital control circuit 14 of FIG. 2A.
Figure 6A:
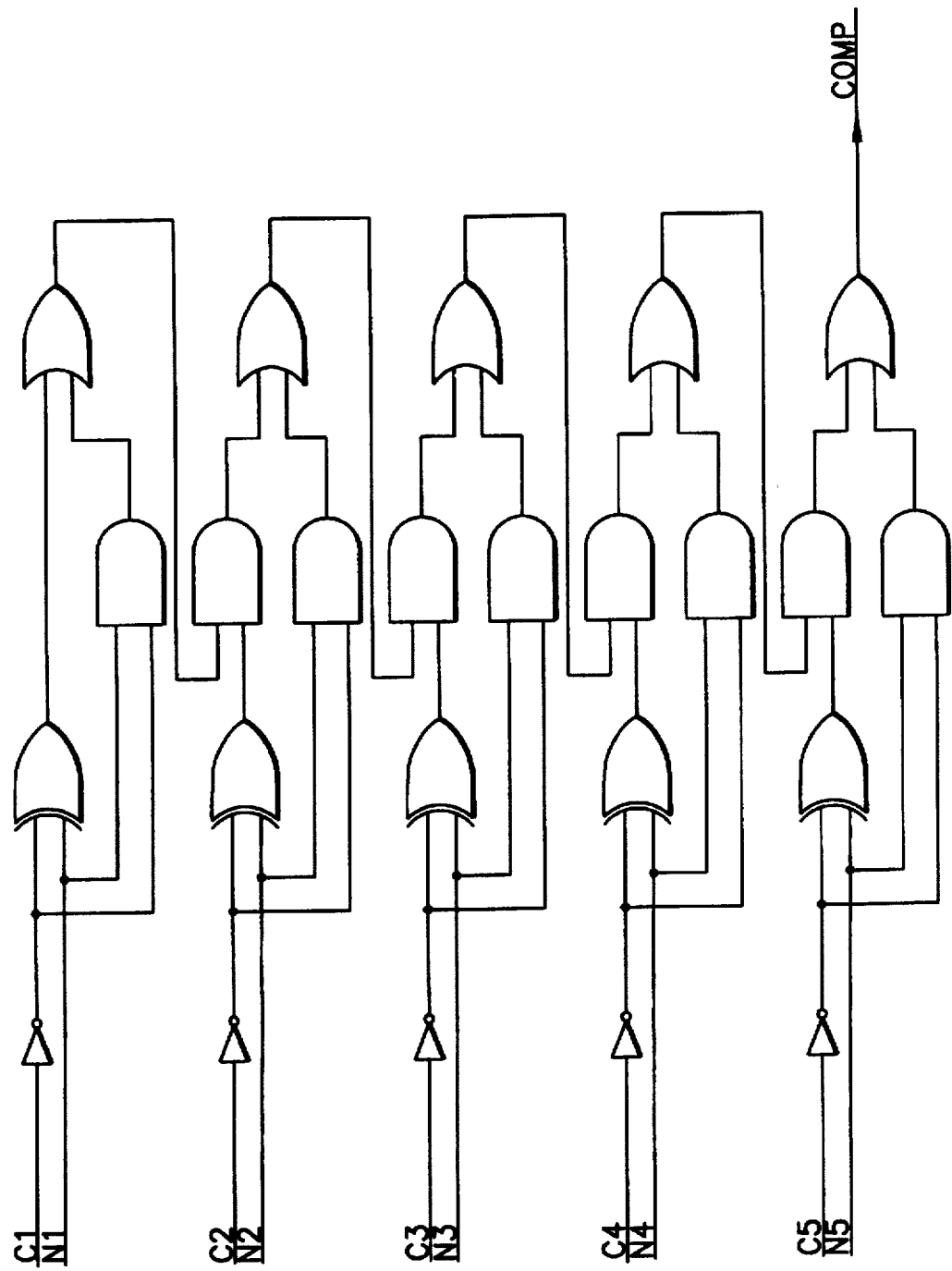
FIG. 6A is a block diagram of a magnitude comparator for use in the digital control circuit of FIG. 5.
Figure 6B:
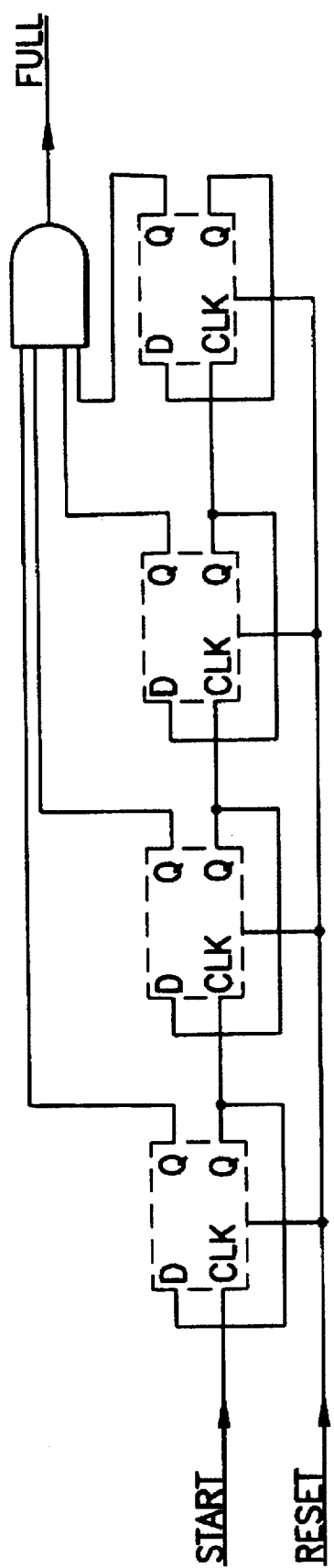
FIG. 6B is a block diagram of a 4-bit counter for use in the digital control circuit of FIG. 5.

As described in the foregoing discussion, the complete AGC system shown in FIG. 2A has four main components: an AC-to-DC converter 10, shown in detail in FIG. 3A; an A/D converter 12, shown in detail in FIG. 4; a digital control circuit 14, shown in detail in FIGS. 5, 6A, and 6B; and a PGA 16.

Figure 3B:
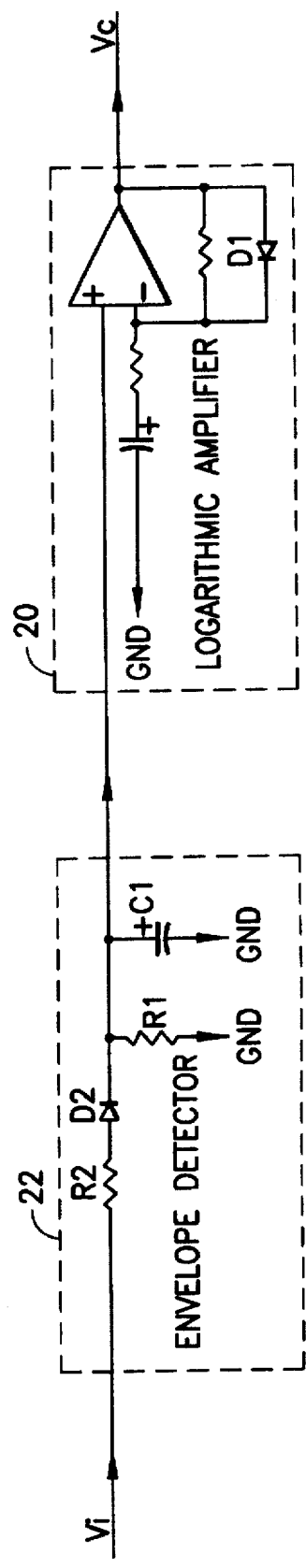
FIG. 3B is a block diagram of a modified AC-to-DC converter.

The AC-to-DC converter 10 of FIG. 3A generates the control voltage Vc as a function of the amplitude of input signal Vi. Two circuits are necessary to accomplish this function: a logarithmic amplifier 20, which introduces a logarithmic relationship between signals Vc and Vi, and an envelope detector circuit 22, which extracts the amplitude information from input signal Vi and converts it to control signal Vc. Although FIG. 3A shows the logarithmic amplifier stage 20 followed by the detector circuit stage 22, the same characteristic would be obtained for Vc if the order of the two stages was reversed, as shown in FIG. 3B. The logarithmic amplifier 20 is a standard operational amplifier (op-amp) with enough closed-loop gain to cover the dynamic range of input signal Vi, and with one diode D1 in the feedback circuit. The diode D1 provides a logarithmic response in the positive swing of the output waveform. (The detector 22 is driven only by the positive half of the waveform, and therefore it is not necessary to add another diode for the negative half.) The envelope detector 22 is simply a diode D2 in series with a resistor R2 driving a capacitor C1 in parallel with a resistor R1. The product R2*C1 (time constant) controls the AGC attack time and should be about 20 ms, whereas the product Ri*C1 controls the recovery time and should be about 1 s to 5 s (seconds), depending on the functional application of the AGC. Control signal Vc is the voltage across capacitor C1 and feeds directly to the A/D converter 12 input.

The A/D converter 12 can be a simple counter-controlled type converter, as shown in FIG. 4. A START signal resets a 5-bit counter 26 and initiates a 32-step count. The outputs of counter 26 drive a digital-to-analog (D/A) converter 24 that generates a "staircased" linear voltage ramp as the count increases from 00000 to 11111. The upper and lower voltage limits of the ramp represent the upper and lower limits of the A/D converter range, respectively. Control voltage Vc and the linear ramp are then fed to a comparator 28. When the ramp voltage becomes greater than Vc, the output of comparator 28 changes state and stops the counter 26; the conversion is complete and an end-of-conversion (EOC) digital pulse is generated. The output of the counter 26 in this state is a binary representation of input voltage Vc with an error of +/- 1 LSB.

The cycle is repeated by a 500 Hz clock that provides a START signal every 2 ms. In an ordinary A/D converter, the conversion result normally would be loaded to a digital register by signal EOC, so that the counter 26 can be reset to start another conversion. In the present application, however, a conversion reading is not necessarily accepted as valid until it is processed by the digital control circuit 14 of FIG. 2A.

The digital control circuit, shown in detail in FIG. 5, mediates the transmission of data from the A/D converter 12 to the PGA 16 through a 5-bit register 18. At the end of each conversion cycle, the control circuit decides whether the register 18 should be updated with a new reading Ni. The decision process is intended to stabilize the output Vo against the +/− 1 LSB variation of the A/D converter. A START signal, occurring every 2 ms, initiates a conversion cycle in the A/D converter and at the same time increments a 4-bit digital counter 32 by one count. The digital counter 32 can be a simple 4-bit asynchronous counter, as shown in FIG. 6B. When the conversion is completed and the new reading Ni is available to be read, an EOC pulse is generated by the A/D converter. A magnitude comparator 30 compares the new reading Ni at the output of the converter 12 to the current setting Ci of the PGA 16 (the output of the register 18), and provides an output COMP according to the following rules: COMP=0 if Ni is less than Ci, and COMP=1 if Ni is greater than or equal to Ci. The magnitude comparator 30 can be simply a digital subtractor circuit, as shown in FIG. 6A.

Assume that the AGC system is at maximum gain (no input signal Vi is applied), and suddenly a constant input Vi is applied that causes Vc to be 1 V. Further, suppose that the expected A/D converter reading for Vc=1V is 01010 (decimal 10). Depending on noise present in the A/D converter internal voltage references and in signal Vc (as previously discussed), on repeated conversion cycles the reading Ni can be 01001 (decimal 9), 01010 (decimal 10), or 01011 (decimal 11), even though Vc is still equal to 1V. If Ni is equal to decimal 11 on the first conversion cycle after Vc=1V, then Ni is greater than the previous setting Ci (equal to 0 or 1 because no signal Vi was applied to the AGC and Vc was 0 V) and the output COMP of the magnitude comparator 30 is set to HIGH. The EOC pulse then loads the control COMP (HIGH) to the output of a D-type flip-flop 34, which causes the output UPDATE of an OR gate 38 to go HIGH and at the same time resets the 4-bit counter 32. Control UPDATE then causes the new reading Ni (decimal 11) to be loaded to the output of the register 18, thereby decreasing the PGA gain. Note that the PGA gain is decreased immediately as soon as a high reading (corresponding to a large signal applied) is detected by the control circuit. This property of the decision circuit allows the AGC system to comply with the requirement of a fast attack time.

If the next reading of the A/D converter is decimal 9 or 10 (even though Vc is still equal to 1 V), the output COMP of the magnitude comparator 30 goes LOW (Ni is less than Ci), and a logic LOW is loaded to the output of flip-flop 34. In this case the counter 32 is not reset, the control UPDATE remains LOW, and the register 18 is not updated. In other words, if the A/D converter reads decimal 9 or 10 due to noise or inaccuracy in the A/D converter, the register 18 is not updated immediately. The 4-bit counter 32 is allowed to increment by one step (out of 16 steps) every time a reading is lower than decimal 11, but it is reset every time the reading is equal to decimal 11. If the counter 32 is incremented by 15 steps, an output FULL of the counter 32 is set to HIGH and then loaded by the next EOC pulse to the output of a D-type flip-flop 36, which sets the output UPDATE of the OR gate 38 to HIGH and updates the register 18 (decreasing the gain of the PGA). However, it would take 15 consecutive readings lower than decimal 11 (in this case decimal 9 or 10) to update the register 18 with a value less than 11. Due to the random nature of the A/D converter error, if signal Vc remains constant at 1 V (which is the case in this analysis) a reading of decimal 11 most likely will occur in the A/D converter within 15 consecutive conversion cycles and the counter 32 will be reset. This condition does not allow the counter 32 to become full and update the register 18 with a value lower than decimal 11, effectively maintaining the PGA gain constant for a constant input Vi (and a constant control voltage Vc), as desired.

Finally, suppose that the input Vi is decreased in amplitude such that Vc=0.5 V, corresponding to an A/D reading of 00101 (decimal 5). In this case, for every conversion cycle after Vc is set to 0.5 V the new reading Ni (equal to decimal 4, 5, or 6) will be less than the PGA setting Ci (equal to 11), and therefore the counter 32 becomes full within 15 cycles or 30 ms (2 ms * 15). This condition causes the register 18 to be updated with a lower reading and the gain of the PGA to increase, as desired. Note that the 30 ms delay introduced by the control circuit when reducing the gain does not compromise the speed of the AGC response because the recovery time is about 1 s to 5 s, which is much larger than the 30 ms delay.

The PGA 16 is a digitally programmable amplifier with 32 gain steps (in the present example) controlled by 5 logic bits. As explained earlier in the discussion, the gain characteristic of this amplifier as a function of the digital setting is exponential, and the gain range should be greater than or equal to the AGC dynamic range. If a 32 dB dynamic range is expected, for example, each digital step should increase the gain by 1 dB. Various design alternatives can be used to enable integration of a PGA in an integrated circuit, but will not be discussed in this context because they depend on the fabrication process and device manufacturer selected.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention as defined in the appended claims are desired to be protected.

I claim:

1. A digital automatic gain control system having a system input and a system output, comprising:

a detector coupled to said system input and for converting an AC input signal into a control output signal;

an analog-to-digital converter having an input coupled to receive the control output signal of the detector;

said analog-to-digital converter comprising a counter, a digital-to-analog converter coupled to said counter, and a comparator for comparing an output of said digital-to-analog converter with a control signal; and a programmable gain amplifier having an input coupled to receive the AC input signal from the system input, and an output coupled to the automatic gain control system output, and further having control inputs coupled to receive an output of the analog-to-digital converter for controlling the gain of the programmable gain amplifier such that the automatic gain control system output signal level remains substantially constant as the signal level at the system input varies.

2. The automatic gain control system of claim 1, further comprising:

a non-linear amplifier coupling the system input to the input of the detector; and wherein the programmable gain amplifier has a control law which is an inverse function of that of the non-linear amplifier.

3. The automatic gain control system of claim 1, further comprising:
   a non-linear amplifier coupling the output of the detector to the analog-to-digital converter; and
   wherein the programmable gain amplifier has a control law which is an inverse function of that of the non-linear amplifier.

4. The automatic gain control system of claim 1, further comprising control means for eliminating noise on a control voltage.

5. The automatic gain control system of claim 4, wherein said control means comprises a magnitude comparator and a digital counter.

6. The automatic gain control system of claim 4, wherein said control means has a transfer function.

7. The automatic gain control system of claim 1, wherein said analog-to-digital converter has a non-linear transfer function.

8. The automatic gain control system of claim 1, further comprising a digital register coupled between said analog-to-digital converter and said programmable gain amplifier, and having an output which is updated by a digital control circuit.

9. An automatic gain control system having an input and an output, comprising:
   a detector having an input coupled to the automatic gain control output;
   an analog-to-digital converter having an input coupled to an output of the detector;
   a control circuit having an input coupled to the output of the analog-to-digital converter; and
   a programmable gain amplifier having an input coupled to the automatic gain control input and an output coupled to the automatic gain control output, and control inputs coupled to an output of the control circuit;
   said analog-to-digital converter comprising a counter, a digital-to-analog converter coupled to said counter, and a comparator for comparing an output of said digital-to-analog converter with a control signal; and
   wherein the automatic gain control output signal level remains substantially constant as the automatic gain control input level varies within a specified dynamic range.

10. The automatic gain control system of claim 9, further comprising:
    a non-linear amplifier having an input coupled to the automatic gain control output and an output coupled to the input of the detector; and
    wherein the programmable gain amplifier has a control law which is an inverse function of that of the non-linear amplifier.

11. The automatic gain control system of claim 9, further comprising:
    a non-linear amplifier coupling the output of the detector to the input of the analog-to-digital converter; and
    wherein the programmable gain amplifier has a control law which is an inverse function of that of the non-linear amplifier.

12. The automatic gain control system of claim 9, further comprising control means for eliminating noise on a control voltage.

13. The automatic gain control system of claim 12, wherein said control means comprises a magnitude comparator and a digital counter.

14. The automatic gain control system of claim 12, wherein said control means has a transfer function.

15. The automatic gain control system of claim 9, wherein said analog-to-digital converter has a non-linear transfer function.

16. The automatic gain control system of claim 9, further comprising a digital register coupled between said analog-to-digital converter and said programmable gain amplifier, and having an output which is updated by said control circuit.

* * * * *